(12) United States Patent
Kang et al.

(10) Patent No.: US 8,415,873 B2
(45) Date of Patent: Apr. 9, 2013

(54) ORGANIC LIGHT EMITTING DISPLAY DEVICE INCLUDING A LIGHT TRANSMISSION ADJUSTING UNIT

(75) Inventors: Jin-Goo Kang, Yongin (KR); Mu-Hyun Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 149 days.

(21) Appl. No.: 12/981,999

(22) Filed: Dec. 30, 2010

(65) Prior Publication Data

US 2011/0163664 A1  Jul. 7, 2011

(30) Foreign Application Priority Data

Jan. 5, 2010 (KR) .................. 10-2010-0000567

(51) Int. Cl.
*H01L 51/50* (2006.01)
*G09G 3/32* (2006.01)
*H01J 9/00* (2006.01)

(52) U.S. Cl. .................. 313/504; 345/82; 445/24

(58) Field of Classification Search .......... None
See application file for complete search history.

(56) References Cited

U.S. PATENT DOCUMENTS

| | | | |
|---|---|---|---|
| 7,978,288 B2 * | 7/2011 | Chan et al. ............ | 349/114 |
| 2006/0107566 A1 | 5/2006 | Van Rens | |
| 2007/0069995 A1 | 3/2007 | Shin et al. | |
| 2008/0238828 A1 | 10/2008 | Nakayama et al. | |

FOREIGN PATENT DOCUMENTS

| | | |
|---|---|---|
| JP | 2004-271830 | 9/2004 |
| KR | 10-2005-0085412 | 8/2005 |
| KR | 10-0600354 | 7/2006 |
| KR | 10-2007-0029680 | 3/2007 |
| KR | 10-0739297 | 7/2007 |
| KR | 10 2007-0103180 A | 10/2007 |
| KR | 10-2009-0100920 A | 9/2009 |

OTHER PUBLICATIONS

Office Action issued in corresponding Korean application, 10-2010-0000567, dated Mar. 16, 2011.
Korean Notice of Allowance in KR 10-2010-0000567, dated Oct. 27, 2011 (Kang, et al.).
English-language abstract of Korean Patent Publication No. 10-2005-0122591.

* cited by examiner

*Primary Examiner* — Britt D Hanley
(74) *Attorney, Agent, or Firm* — Lee & Morse, P.C.

(57) ABSTRACT

An organic light emitting display device that prevents distortion of the image by preventing the transmitting light from scattering, and by preventing the degradation of the brightness and color coordinates caused by external light transmitting through the organic light emitting display device. The device includes a transmitting region and separate pixel regions interposed within the transmitting region; thin film transistors, a passivation film covering each thin film transistor; a pixel electrode that is electrically connected to the corresponding thin film transistor; an opposite electrode that faces the pixel electrode and is able to transmit light; an organic light emission layer that is interposed between the pixel electrode and the opposite electrode; a first electrode formed on a second surface of the substrate; a second electrode facing the first electrode; and a light transmission adjusting layer disposed between the first electrode and the second electrode.

30 Claims, 9 Drawing Sheets

ORGANIC LIGHT EMITTING DISPLAY DEVICE INCLUDING A LIGHT TRANSMISSION ADJUSTING UNIT

CROSS-REFERENCE TO RELATED APPLICATIONS

This application claims the benefit of Korean Application No. 10-2010-0000567, filed Jan. 5, 2010 in the Korean Intellectual Property Office, the disclosure of which is incorporated herein by reference.

BACKGROUND OF THE INVENTION

1. Field of the Invention

Aspects of the present invention relate to an organic light emitting display device, and more particularly, to a transparent organic light emitting display device.

2. Description of the Related Art

Applications of organic light emitting display devices range from personal portable devices such as MP3 players and mobile phones to television sets because the devices have superior characteristics such as wide viewing angles, high contrast ratios, short response times, and low power consumption.

An organic light emitting display device has self-light emitting characteristics, and therefore weight and thickness of the organic light emitting display device may be reduced since the organic light emitting display device does not require an additional light source, unlike a liquid crystal display device. Also, an organic light emitting display device can be a transparent organic light emitting device and can be formed into a transparent display device by having transparent thin film transistors.

When a transparent display device is off, an object or an image positioned on a side of the device opposite to the user is transmitted to the user through not only organic light emitting devices but also through spaces between patterns of thin film transistors and various wires. Therefore, a distorted image is transmitted to the user due to the patterns. The reason for this is because gaps between the patterns are only a few nanometers, that is, at a level almost close to the wavelengths of visible light, and thus, the gaps scatter light therethrough.

In addition, external light is incident from the opposite side of the surface on which the image is displayed while displaying the image, and thus, the image light and the external light are mixed together. Thus, brightness and color coordinates of the image, which were predicted originally, may not be realized well.

SUMMARY OF THE INVENTION

Aspects of the present invention provide a transparent organic light emitting display device that can prevent distortion of an image transmitted therethrough by preventing light transmitting therethrough from scattering.

Aspects of the present invention also provide an organic light emitting display device that may prevent brightness and color coordinates from degrading due to external light transmitted through the organic light emitting display device while the device is displaying images.

An aspect of the present invention provides an organic light emitting display device including: a substrate having a transmitting region and a plurality of separate pixel regions interposed within the transmitting region; thin film transistors that are positioned on a first surface of the substrate, each disposed in one of the pixel regions of the substrate; a passivation film covering each thin film transistor and the transmitting region; pixel electrodes that are formed on the passivation film, each pixel region electrically connected to the corresponding thin film transistor in the corresponding pixel region and disposed to overlap and cover the corresponding thin film transistor; an opposite electrode that faces the pixel electrodes and is formed to be able to transmit light; an organic light emission layer that is interposed between the pixel electrodes and the opposite electrode to emit light; a first electrode formed on a second surface of the substrate; a second electrode facing the first electrode; and a light transmission adjusting layer disposed between the first electrode and the second electrode.

Another aspect of the present invention provides an organic light emitting display device including: a substrate having a transmitting region and a plurality of separate pixel regions interposed within the transmitting region; pixel circuit units that are formed on a first surface of the substrate, each comprising a thin film transistor, and each positioned in the corresponding pixel region; a first insulating film covering the pixel circuit units; pixel electrodes that are formed on the first insulating film, each electrically connected to the corresponding pixel circuit unit, and each disposed to overlap and cover the corresponding pixel circuit unit; an opposite electrode facing the pixel electrodes; an organic light emission layer that is interposed between each of the pixel electrodes and the opposite electrode to emit light; a first electrode formed on a second surface of the substrate; a second electrode facing the first electrode; and a light transmission adjusting layer disposed between the first electrode and the second electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
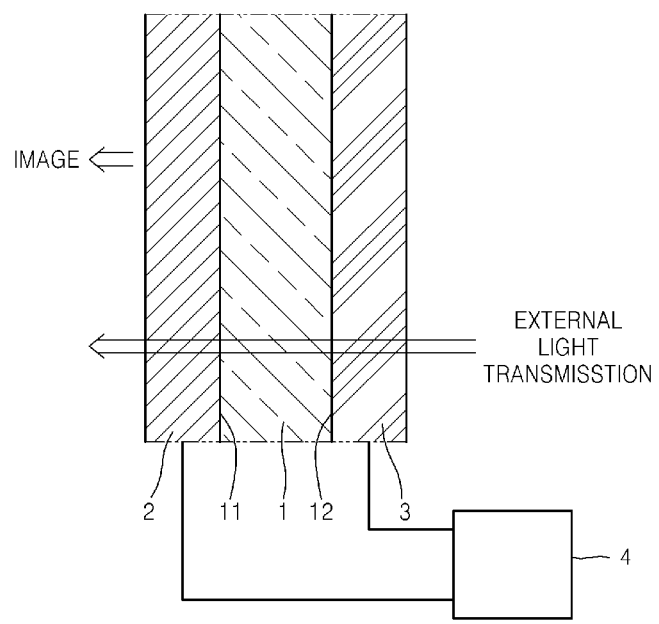
FIG. 1 is a cross-sectional view of an organic light emitting display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of an organic light emitting display device according to an embodiment of the present invention. Referring to FIG. 1, in the organic light emitting display device according to an embodiment of the present invention, a display unit 2 is formed on a first surface 11 of a first substrate 1 and a light transmission adjusting unit 3 is formed on a second surface 12 of the first substrate 1. The first substrate 1 is formed of a transparent material, such as a transparent glass or a transparent plastic. The first surface 11 and the second surface 12 face each other. The first substrate 1 is not necessarily a single substrate, but may include at least two substrates attached to each other. That is, a substrate having the first surface 11 on which the display unit 2 is formed and a substrate having the second surface 12 on which the light transmission adjusting unit 3 is formed may be bonded to each other to form the first substrate 1. In the organic light emitting display device, external light enters through the light transmission adjusting unit 3, the first substrate 1, and the display unit 2, and a part of the external light is absorbed in the light transmission adjusting unit 3.

As will be described later, the display unit 2 is formed to transmit external light. That is, referring to FIG. 1, the display unit 2 is formed in such a way that a user positioned on the side where an image is displayed may be observing outside the light transmission adjusting unit 3. In the organic light emitting display device according to this embodiment of the present invention, the display unit 2 and the light transmission adjusting unit 3 may be connected to a separate controller 4.

Figure 2:
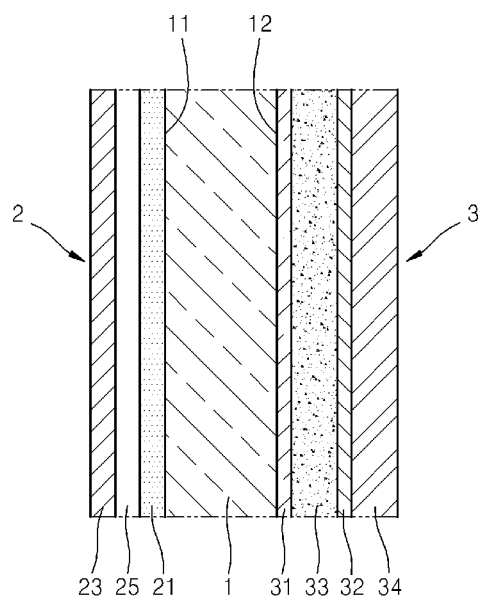
FIG. 2 is a cross-sectional view showing details of the embodiment of the organic light emitting display device of FIG. 1.

FIG. 2 is a cross-sectional view showing details of the embodiment of the organic light emitting display device of FIG. 1. The display unit 2 includes an organic light emitting unit 21 formed on the first surface 11 of the first substrate 1 and a sealing substrate 23 to seal the organic light emitting unit 21.

The sealing substrate 23 may be formed of a transparent material to allow viewing of an image generated by the organic light emitting unit 21 and to prevent external air and moisture from penetrating into the organic light emitting unit 21. Edges of the sealing substrate 23 and the organic light emitting unit 21 are sealed by a sealant (not shown), and thus, a space 25 is formed between the sealing substrate 23 and the organic light emitting unit 21. The space 25 may be filled with an absorbent or filler.

Figure 3:
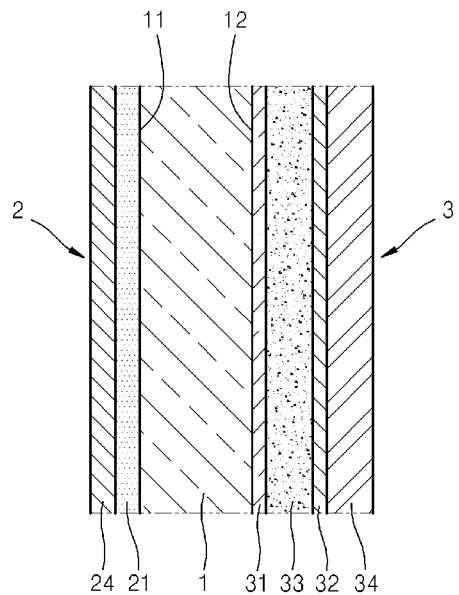
FIG. 3 is a cross-sectional view showing details of another embodiment of the organic light emitting display device of FIG. 1.

FIG. 3 is a cross-sectional view showing details of another embodiment of the organic light emitting display device of FIG. 1. As shown in FIG. 3, a thin sealing film 24 may be formed on the organic light emitting unit 21 to protect the organic light emitting unit 21 from external air. The thin sealing film 24 may have a structure in which a film formed of an inorganic material such as silicon dioxide or silicon nitride and a film formed of an organic material such as epoxy or polyimide are alternately stacked, but is not limited thereto, and the thin sealing film 24 may have any thin film type sealing structure.

The light transmission adjusting unit 3 includes a first electrode 31 formed on the second surface 12 of the first substrate 1, a second electrode 32 facing the first electrode 31, and a light transmission adjusting layer 33 disposed between the first electrode 31 and the second electrode 32. The second electrode 32 is formed on a second substrate 34, which is attached to the first substrate 1 by an additional sealant (not shown).

The first and second electrodes 31 and 32 may be transparent electrodes formed of a material such as indium tin oxide (ITO), indium zinc oxide (IZO), $In_2O_3$, or ZnO. The light transmission adjusting layer 33 may include an electrochromic device, for example, which may include an electrochromic layer and an electrolyte formed on the first electrode 31. The electrochromic layer may be formed of, for example, tungsten oxide ($WO_3$), $MoO_3$, $TiO_2$, or $V_2O_5$. The electrolyte is sealed by a sealant (not shown), and a liquid electrolyte or a solid electrolyte may be used as the electrolyte.

The electrochromatic device may be formed of an electrolyte including a stain. For example, the electrochromatic device may be formed of an electrolyte that is obtained by dissolving a cathode compound such as a viologen derivative, and an anode compound such as a metallocene ($M(C_5G_5)_2$) derivative in an nonaqueous solvent.

The color of the light transmission adjusting layer 33 is changed due to oxidation and reduction in the electrolyte when a predetermined voltage is applied between the first and second electrodes 31 and 32. Operations of the light transmission adjusting layer 33 will be described in more detail as follows.

Figure 4:
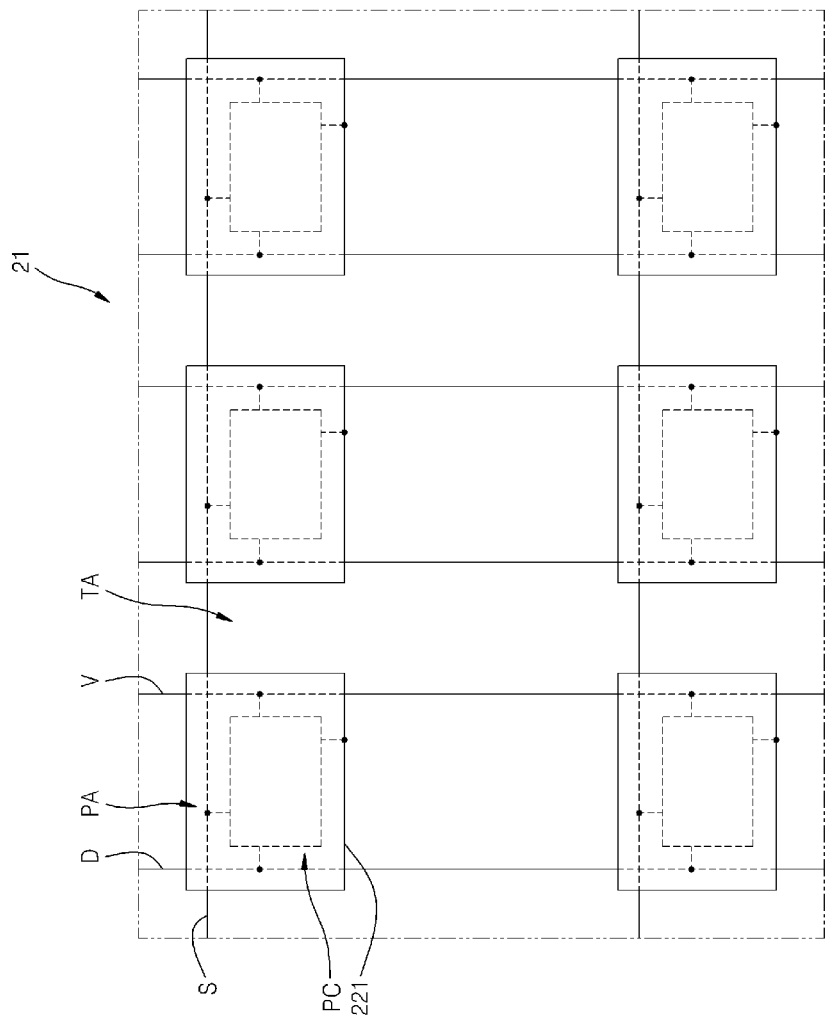
FIG. 4 is a schematic diagram of an example of the organic light emitting unit of FIG. 2 or FIG. 3.

FIG. 4 is a schematic drawing of an example of the organic light emitting unit 21 of FIG. 2 or FIG. 3. Referring to FIGS. 2 through 4, according to an embodiment of the present invention, the organic light emitting unit 21 is formed on the first substrate 1. A transmitting region TA for transmitting external light and pixel regions PA are separated from each other. The pixel regions are separate from each other and interposed within the transmitting region TA.

Each of the pixel regions PA includes a pixel circuit unit PC, and a plurality of conductive lines, such as a scan line S, a data line D, and a driving power line V, are electrically connected to the pixel circuit unit PC. Although not shown, various other conductive lines besides the scan line S, the data line D, and the driving power line V may further be connected to the pixel circuit unit PC according to the configuration of the pixel circuit unit PC.

Figure 5:
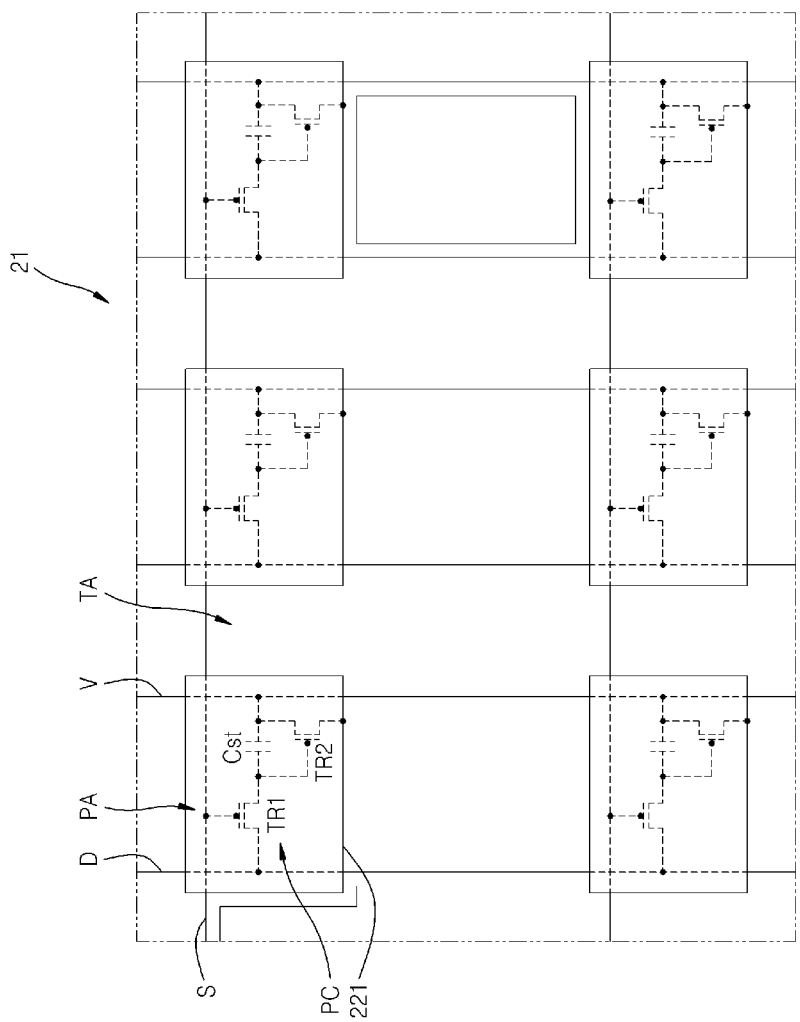
FIG. 5 is a schematic drawing of the organic light emitting unit of FIG. 4 including an example of a pixel circuit unit.

FIG. 5 shows an example of a pixel circuit unit PC that includes a first thin film transistor TR1 connected to the scan line S and the data line D, a second thin film transistor TR2 connected to the first thin film transistor TR1 and the driving power line V, and a capacitor Cst connected to the first and second thin film transistors TR1 and TR2. In this embodiment, the first thin film transistor TR1 is a switching transistor and the second thin film transistor TR2 is a driving transistor. The second thin film transistor TR2 is electrically connected to a pixel electrode 221. In FIG. 5, the first and second thin film transistors TR1 and TR2 are P-type transistors, but are not limited thereto, and at least one of the first and second thin film transistors TR1 and TR2 may be an N-type transistor. According to an embodiment of the present invention, all the conductive lines including scan line S, data line D, and driving power line V are disposed to cross the pixel region PA, and no conductive lines cross only the transmitting regions TA.

The pixel regions PA are light emitting regions. Since the pixel circuit unit PC is located in the light emitting regions and all the conductive lines cross the light emitting regions, the user can see images through the pixel regions PA and can see an outside view through the transmitting region TA. Thus, external light may be prevented from scattering caused by interfering with the patterns of internal devices of the pixel circuit unit PC, thereby preventing external image distortion.

Although the conductive lines including scan line S, data line D, and driving power line V are disposed to cross the transmitting region TA between the pixel regions PA, since the conductive lines are formed to be very thin, the conductive lines can hardly be observed by the user and have little effect on the overall transmittance of the organic light emitting unit 21, and accordingly, a transparent display can be realized. Also, although the user may not see the external image as much in regions covered by the pixel regions PA, in consideration of the overall display region, there is little effect on observing the external image since the pixel regions PA are like a plurality of dots regularly arranged on a surface of a transparent glass.

The transmitting regions TA and the pixel regions PA are formed in such a way that the ratio of the area of the transmitting regions TA with respect to the overall area of the transmitting region TA and the pixel regions PA is between about 20% and about 90%. If the ratio of the area of the transmitting region TA with respect to the overall area of the transmitting region TA and the pixel regions PA is less than 20%, with respect to FIG. 1, the user can hardly see an object or image on a side opposite to the user due to a lack of light that can transmit through the display unit 2 when the display unit 2 is in an off-state. That is, it cannot be said that the display unit 2 is transparent. Although the ratio of the area of the transmitting region TA with respect to the overall area of the transmitting region TA and the pixel regions PA may be approximately 20%, the pixel regions PA are present in an independent or isolated state with respect to the transmitting region TA, and scattering of light is minimized since all conductive patterns are disposed across the pixel regions PA. Thus, the display unit 2 may be recognized as a transparent display unit by the user. As will be described later, when a transistor included in the pixel circuit unit PC is formed of a transparent thin film transistor (TFT), such as an oxide semiconductor, and an organic light emitting device is a transparent device, the display unit 2 may further be recognized as a transparent display unit. In this case, unlike a conventional transparent display unit, if possible, all conductive patterns are disposed across the pixel regions PA. Accordingly, scattering of light can be prevented, and thus, the user can see an undistorted external image.

If the ratio of the area of the transmitting regions TA with respect to the entire area of the pixel regions PA and the transmitting regions TA is greater than 90%, pixel integrity of the display unit 2 is reduced excessively, and thus, a stable image can hardly be realized through the light emission from the pixel regions PA. That is, as the area of the pixel regions PA is reduced, the amount of light emitted from an organic light emitting film 223 (see FIG. 10) may be increased in order to realize an image. However, if the organic light emitting device is operated to emit light having a high brightness, the lifetime of the organic light emitting device is rapidly reduced. Also, when the ratio of the area of the transmitting region TA with respect to the entire are of the pixel regions PA and the transmitting region TA is greater than 90% while the size of a single pixel region PA is maintained at an appropriate size, the number of pixel regions PA is reduced, and accordingly, the resolution of the organic light emitting device is reduced.

The ratio of the area of the transmitting region TA with respect to the entire area of the pixel regions PA and the transmitting region TA may further be in a range of about 40% to about 70%. When the ratio of the area of the transmitting region TA with respect to the entire area of the pixel regions PA and the transmitting region TA is less than 40%, the ratio of the area of the pixel regions PA with respect to the area of the transmitting region TA is excessively increased. Therefore, the user has a limit in observing an external image through the transmitting regions TA. When the ratio of area of the transmitting region TA with respect to the entire area of the pixel regions PA and the transmitting region TA exceeds 70%, there are a lot of limitations in designing the pixel circuit units PC.

Figure 6:
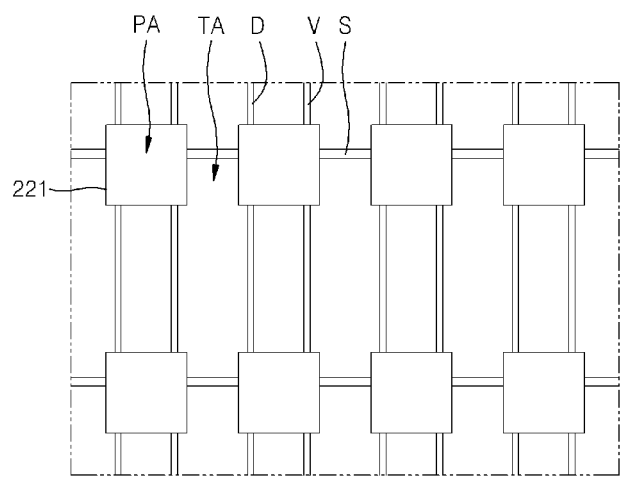
FIG. 6 is a plan view of an example of the organic light emitting unit of FIG. 5.

Each of the pixel regions PA includes a pixel electrode 221 that has an area corresponding to the area of pixel regions PA and is electrically connected to the pixel circuit unit PC. The pixel circuit unit PC overlaps with the pixel electrode 221 so that the pixel circuit unit PC may be covered by the pixel electrode 221. Also, the conductive lines including the scan line S, the data line D, and the driving power line V are disposed to cross the pixel electrode 221. According to an embodiment of the present invention, the pixel electrode 221 may have an area equal to or slightly smaller than that of the pixel region PA. Accordingly, as shown in FIG. 6, when the user observes the organic light emitting unit 21, the pixel circuit unit PC described above is covered by the pixel electrode 221 and a large portion of the conductive lines are also covered. Therefore, scattering of light is greatly reduced as described above and the user only sees a portion of the conductive lines through the transmitting regions TA. Accordingly, the user may be able to observe an undistorted external image.

Figure 7:
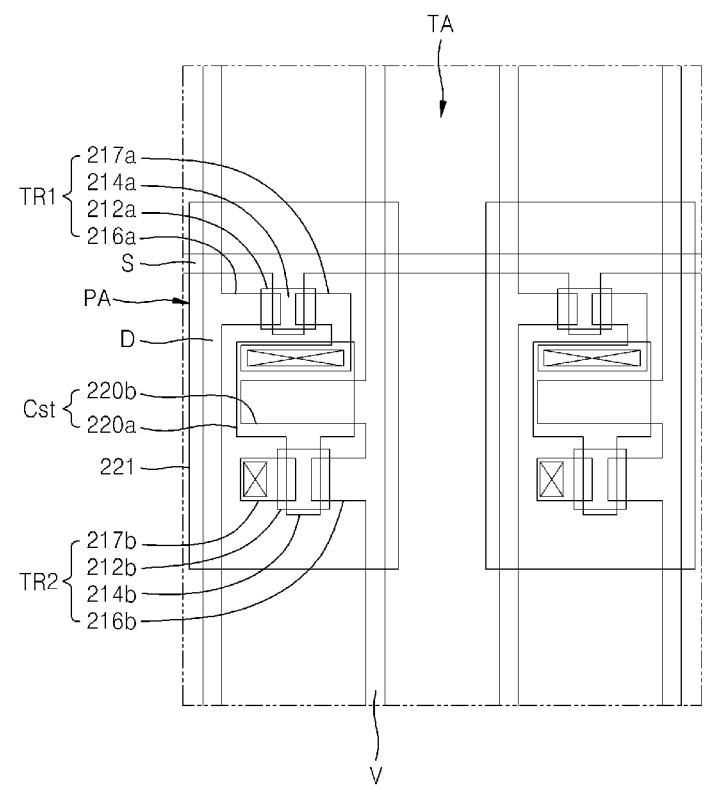
FIG. 7 is a detailed plan view of the pixel unit of the organic light emitting unit of FIG. 4.
Figure 8:
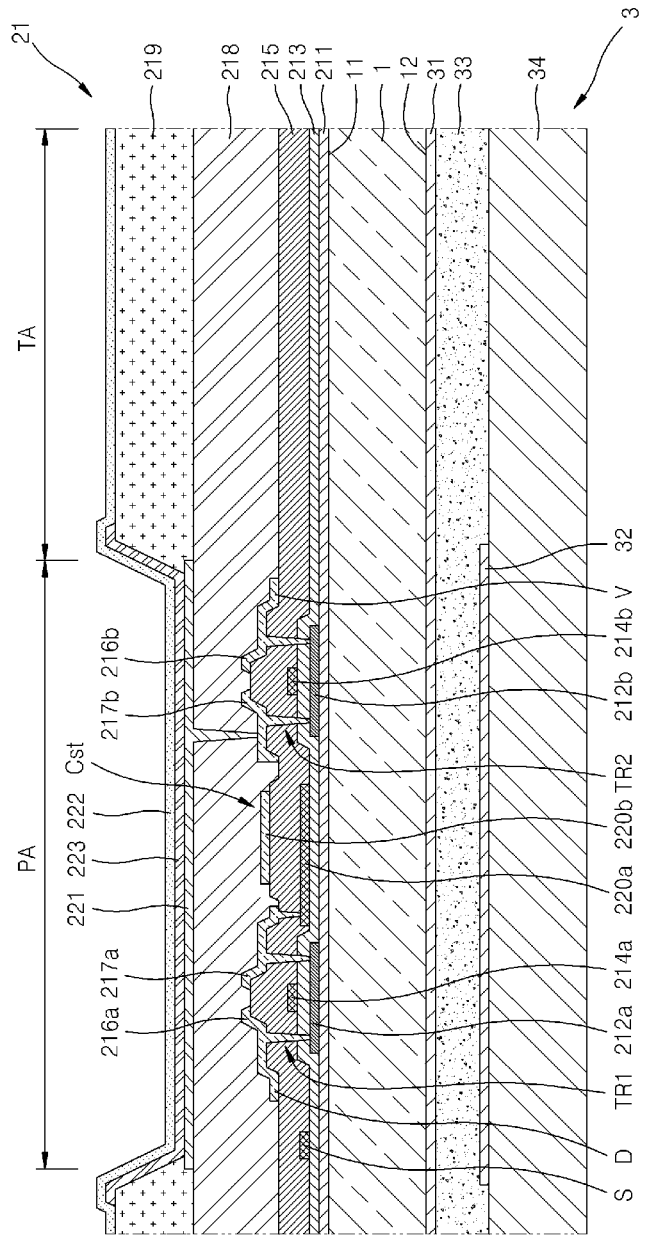
FIG. 8 is a cross-sectional view of an organic light emitting display device showing the pixel circuit unit of FIG. 5 in detail.

FIG. 7 is a detailed plan view of the pixel unit of the organic light emitting unit 21 of FIG. 5 for explaining the organic light emitting unit 21, and FIG. 8 is a cross-sectional view of an organic light emitting display device, showing the pixel circuit unit PC of FIG. 5 in detail. According to an embodiment of the present invention shown in FIGS. 7 and 8, in the organic light emitting unit 21 of FIG. 7, a buffer film 211 is formed on the first surface 11 of the first substrate 1, and a first thin film transistor (TFT) TR1, a capacitor Cst, and a second thin film transistor (TFT) TR2 are formed on the buffer film 211.

First, a first semiconductor active layer 212a and a second semiconductor active layer 212b are formed on the buffer film 211. The buffer film 211 prevents impurity elements from penetrating into the organic light emitting unit 21 and planarizes a surface of the organic light emitting unit 21. The buffer film 211 may be formed of any of various materials that can perform the functions described above, for example, an inorganic material such as silicon dioxide, silicon nitride, silicon oxynitride, aluminum oxide, aluminum nitride, titanium oxide, or titanium nitride, an organic material such as polyimide, polyester, or acryl, or stacks of these materials. The buffer film 211 is not an essential element, and may not be formed.

The first and second semiconductor active layers 212a and 212b may be formed of polycrystalline silicon, but are not limited thereto, and may be formed of an oxide semiconductor, for example, a G-I—Z—O layer [a($In_2O_3$)b($Ga_2O_3$)c(ZnO) layer] (where a, b, and c are integers that respectively satisfy $a \geq 0$, $b \geq 0$, and $c > 0$). When the first and second semiconductor active layers 212a and 212b are formed of an oxide semiconductor, optical transmittance can further be increased when it is compared to the polycrystalline silicon.

A gate insulating film 213 covering the first and second semiconductor active layers 212a and 212b is formed on the buffer film 211, and first and second gate electrodes 214a and 214b are formed on the gate insulating film 213. An interlayer insulating layer 215 is formed on the gate insulating film 213 to cover the first and second gate electrodes 214a and 214b. A first source electrode 216a and a first drain electrode 217a and a second source electrode 216b and a second drain electrode 217b are each formed on the interlayer insulating layer 215, and are each connected to the first semiconductor active layer 212a and the second semiconductor active layer 212b through contact holes.

In FIG. 8, the scan line S may be simultaneously formed with the first and second gate electrodes 214a and 214b. The data line D may be simultaneously formed with the first source electrode 216a and connected to the first source electrode 216a. The driving power line V may be simultaneously formed with the second source electrode 216b and connected to the second source electrode 216b.

In the capacitor Cst, a lower electrode 220a is simultaneously formed with the first and second gate electrodes 214a and 214b, and an upper electrode 220b is simultaneously formed with the first drain electrode 217a.

The structures of the first TFT TR1, the capacitor Cst, and the second TFT TR2 are not limited thereto, and any of various types of TFT and capacitor structures may be employed.

A passivation film 218 is formed to cover the first TFT TR1, the capacitor Cst, and the second TFT TR2. The passivation film 218 may be a single layer or multiple layers of insulating film, an upper surface of which is planarized, and may be formed of an inorganic material and/or an organic material.

A pixel electrode 221 covering the first TFT TR1, the capacitor Cst, and the second TFT TR2 may be formed on the passivation film 218. The pixel electrode 221 is connected to the second drain electrode 217b of the second TFT TR2 through a via hole formed in the passivation film 218. As shown in FIG. 6, the pixel electrode 221 is formed as an isolated type independent from other pixel electrodes 221.

A pixel defining film 219 covering edges of the pixel electrode 221 is formed on the passivation film 218. An organic light emission layer 223 and an opposite electrode 222 are sequentially formed on the pixel electrode 221. The opposite electrode 222 is formed on the entire pixel regions PA and the transmitting regions TA.

The organic emission layer 223 may be a low molecular weight organic film or a polymer organic film. When the organic light emission layer 223 is a low molecular weight organic film, the organic light emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic film may be formed by vacuum deposition. At this point, the HIL, the HTL, the ETL, and the EIL are common layers and may be commonly applied to red, green, and blue pixels. Accordingly, unlike the organic emission layer in FIG. 8, the common layers may be formed to cover the pixel regions PA and the transmitting regions TA similar to the opposite electrode 222.

The pixel electrode 221 functions as an anode electrode, and the opposite electrode 222 functions as a cathode electrode. Of course, the polarities of the pixel electrode 221 and the opposite electrode 222 may be reversed.

According to an embodiment of the present invention, the pixel electrode 221 may be a reflection electrode and the opposite electrode 222 may be a transparent electrode. The pixel electrode 221 may include a reflection film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, or an oxide having a high work function such as ITO, IZO, ZnO, or $In_2O_3$. The opposite electrode 222 may be formed of a metal having a low work function such as Ag, Mg, Al, Pt, Pd, Au, Ni, Nd, Ir, Cr, Li, or Ca. Accordingly, the organic light emitting unit 21 is a top emission type in which an image is displayed towards the opposite electrode 222.

When the pixel electrode 221 is a reflection electrode, a pixel circuit unit disposed under the pixel electrode 221 is covered by the pixel electrode 221. Therefore, referring to FIG. 8, at upper outer sides of the opposite electrode 222, the user cannot observe the first TFT TR1, the capacitor Cst, and the second TFT TR2 disposed under the pixel electrode 221, or portions of the scan line S, the data line D, and the driving power line V. Accordingly, a clear external image may be seen since distortion of the external image due to each of the patterns that constitute the organic light emitting unit 21 is not generated.

The present invention is not limited to the above embodiment. For example, the pixel electrode 221 can also be a transparent electrode. In this case, the pixel electrode 221 is formed of an oxide having a high work function, such as ITO, IZO, ZnO, or $In_2O_3$. If the pixel electrode 221 is transparent, at the upper outer sides of the opposite electrode 222, the user can observe the first TFT TR1, the capacitor Cst, and the second TFT TR2 disposed under the pixel electrode 221, as well as portions of the scan line S, the data line D, and the driving power line V. However, although the pixel electrode 221 is transparent, there is a loss of light since the transmittance of light therethrough cannot be 100%, and the transmittance of external light is further reduced due to the pixel electrode 221 since the conductive patterns are disposed in the region of the pixel electrode 221. Therefore, interference due to the conductive patterns on the external light is reduced as compared to the case where the external light directly enters the conductive patterns. Therefore, the distortion of an external image is reduced as well.

According to aspects of the present invention, in order to further increase the optical transmittance of the transmitting regions TA, the passivation film 218, the gate insulating film 213, the interlayer insulating layer 215, and the pixel defining film 219 may be formed as transparent insulating films. In this case, the first substrate 1 may have a transmittance greater than or equal to the total transmittance of the transparent insulating films.

The passivation film 218 corresponds to a first insulating film in the appended claims. The gate insulating film 213, the interlayer insulating layer 215, and the pixel defining film 219 correspond to the second insulating film in the appended claims. The sealing substrate 34 of the light transmission adjusting unit 3 of FIG. 2 corresponds to the substrate of the appended claims.

On the other hand, according to this embodiment of the present invention, the controller 4 operates the light transmission adjusting unit 3 when the image is displayed on each of the pixel regions PA to limit the transmittance of the external light. Then, the external light incident into the pixel regions PA may be minimized so that degradation of the brightness and the color purity of the images in the pixel regions PA may be reduced. In more detail, in this embodiment of the present invention, the light transmission adjusting unit 3 is located to correspond to each of the pixel regions PA to operate in communication with the operation of the pixel regions PA.

For example, as shown in FIG. 8, the second electrode 32 formed on the second substrate 34 is formed at a portion corresponding to each of the pixel regions PA. In addition, an area of the second electrode 32 is at least greater than the area of the pixel electrode 221. The second electrode 32 is patterned as an island to exist independently on the portion corresponding to each of the pixel regions PA. At this time, the first electrode 31 may be formed throughout the entire pixel regions PA as a common electrode.

In the above described structure, if a constant voltage is applied to the first electrode 31 and the second electrode 32 is driven in synchronization with the operation of the pixel electrode 221, when the light is emitted from a certain pixel region PA, the light transmission adjusting layer 33 on the second electrode 32 which corresponds to the pixel region PA is discolored in order to restrict the incidence of the external light in the corresponding pixel region PA.

According to this embodiment of the present invention, since the light transmission adjusting layer 33 may be independently operated by each of the pixel regions PA, the image may be clearly displayed on the organic light emitting display device even when external light is also incident on the organic light emitting display device. Of course, the first electrode 31 may be patterned instead of patterning the second electrode 32.

Figure 9:
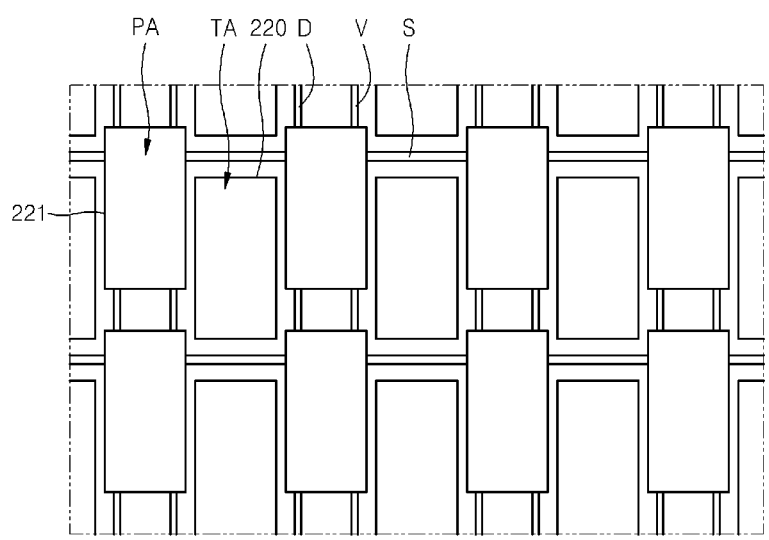
FIG. 9 is a cross-sectional view of another example of the organic light emitting unit of FIG. 5.
Figure 10:
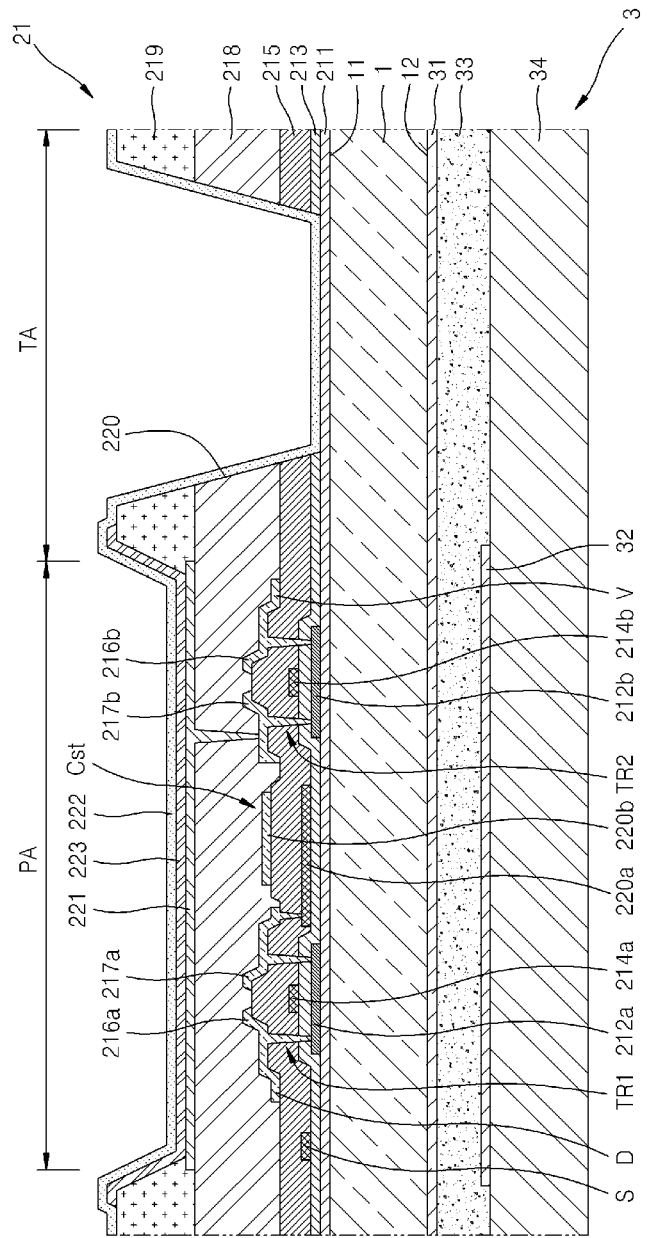
FIG. 10 is a cross-sectional view of an organic light emitting display device according to another embodiment of the present invention.

FIGS. 9 and 10 are cross-sectional views of the organic light emitting unit of another embodiment of the present invention, and show an opening 220 having a predetermined shape, formed in the transparent insulating films in the transmitting region TA.

The opening 220 may be formed as wide as possible as long as the opening 220 does not interrupt the scan line S, the data line D, or the driving power line V, and may be formed to cross the gate insulating film 213, the interlayer insulating layer 215, the passivation film 218, and the pixel defining film 219. In FIG. 9, the opening 220 is not formed in the buffer film 211 in order to prevent impurities from penetrating into the substrate 1. If necessary, the opening 220 may extend to the buffer film 211.

In this way, the formation of the opening 220 in the transmitting regions TA further increases the optical transmittance of the transmitting region TA, and thus, an external image can be more clearly observed by the user. The organic light emitting display device of the present invention may be used as a functional window.

Embodiments of the present invention may provide a transparent organic light emitting display device that can prevent distortion of an image transmitted therethrough by preventing light transmitting therethrough from scattering may be provided. In addition, changes in the brightness and the color coordinates that may occur because of changes from designed parameters where the changes may be due to the external light transmitting through the organic light emitting display device which displays the images may also be solved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display device, comprising:
a substrate having a transmitting region and a plurality of separate pixel regions that are interposed within the transmitting region and that are spaced apart from each other, the plurality of separate pixel regions including a plurality of pixel circuit units, respectively;
thin film transistors that are positioned on a first surface of the substrate, the thin film transistors being on the separate pixel regions, respectively;
a passivation film covering each of the thin film transistors and the transmission region;
pixel electrodes that are reflection electrodes arranged on the passivation film, each of the pixel electrodes being electrically connected to one of the thin film transistors and being disposed to overlap and cover the one of the thin film transistors, and each of the pixel electrodes overlapping an entirety of one of the pixel circuit units, the one of the pixel circuit units including the one of the thin film transistors, one of a plurality of second thin film transistors, and one of a plurality of capacitors;
an opposite electrode that faces the pixel electrodes and that transmits light;
an organic light emission layer that is interposed between the pixel electrodes and the opposite electrode to emit light;
a first electrode on a second surface of the substrate;
second electrodes facing the first electrode, the second electrodes being only in the separate pixel regions and overlapping an entirety of the pixel circuit units, respectively; and
a light transmission adjusting layer between the first electrode and the second electrode.

2. The organic light emitting display device of claim 1, wherein the light transmission adjusting layer is disposed at least on portions corresponding to the pixel regions.

3. The organic light emitting display device of claim 2, wherein a plurality of the light transmission adjusting layers are formed to correspond to the pixel electrodes, and operate independently from each other.

4. The organic light emitting display device of claim 2, further comprising a controller operating the light transmission adjusting layer when the pixel regions display images.

5. The organic light emitting display device of claim 1, further comprising a plurality of conductive lines in the plurality of pixel circuit units,
wherein all of the conductive lines are overlapped by the pixel electrodes.

6. The organic light emitting display device of claim 5, wherein each of the pixel electrodes has an area that is greater than an area of each of the pixel circuit units.

7. The organic light emitting display device of claim 1, wherein the ratio of the total area of the transmitting region with respect to the total area of the pixel regions and the transmitting region is between about 20% and about 90%.

8. The organic light emitting display device of claim 1, wherein the passivation film is formed on both the transmitting region and the pixel regions and is formed of a transparent material.

9. The organic light emitting display device of claim 8, wherein the substrate has a transmittance greater than or equal to that of the passivation film.

10. The organic light emitting display device of claim 1, wherein:
the opposite electrode is a transparent electrode, and
the organic light emitting display device is only a top emission type display in which the image is displayed toward the opposite electrode.

11. An organic light emitting display device, comprising:
a substrate having a transmitting region and a plurality of separate pixel regions that are interposed within the transmitting region and that are spaced apart from each other;
pixel circuit units on a first surface of the substrate, each of the pixel circuit units including a first thin film transistor, a second thin film transistor, and a capacitor, and each of the pixel circuit units being positioned in one of the pixel regions;
a first insulating film covering the pixel circuit units;

pixel electrodes that are reflection electrodes arranged on the first insulating film, each of the pixel electrodes being electrically connected to one of the pixel circuit units, and each of the pixel electrodes overlapping an entirety of one of the pixel circuit units;

an opposite electrode facing the pixel electrodes;

an organic light emission layer that is interposed between each of the pixel electrodes and the opposite electrode to emit light;

a first electrode on a second surface of the substrate;

second electrodes facing the first electrode, the second electrodes being only in the separate pixel regions and overlapping an entirety of the pixel circuit units, respectively; and a light transmission adjusting layer between the first electrode and the second electrode.

12. The organic light emitting display device of claim 11, wherein the light transmission adjusting layer is disposed at least on portions corresponding to the pixel regions.

13. The organic light emitting display device of claim 12, wherein a plurality of the light transmission adjusting layers are formed to correspond to the pixel electrodes, and operate independently from each other.

14. The organic light emitting display device of claim 12, further comprising a controller operating the light transmission adjusting layer when the pixel regions display images.

15. The organic light emitting display device of claim 11, further comprising a plurality of conductive lines within the pixel circuit units, wherein the conductive lines cross the pixel regions.

16. The organic light emitting display device of claim 15, wherein each of the pixel electrodes has an area that is greater than an area of each of the pixel circuit units.

17. The organic light emitting display device of claim 11, wherein the ratio of the total area of the transmitting region with respect to the total area of the pixel regions and the transmitting region is between about 20% and about 90%.

18. The organic light emitting display device of claim 11, wherein the first insulating film is disposed on the transmitting region and the pixel regions, a second insulating film is disposed on the transmitting region and pixel regions, and the first insulating film and the second insulating film is formed of a transparent material.

19. The organic light emitting display device of claim 18, wherein the substrate has a transmittance greater than or equal to the total transmittance of the first insulating film and the second insulating film.

20. The organic light emitting display device of claim 11, wherein:

the opposite electrode is a transparent electrode, and the organic light emitting display device is only a top emission type display in which the image is displayed toward the opposite electrode.

21. The organic light emitting display of claim 1, wherein the substrate is at least two substrates attached to each other.

22. The organic light emitting display of claim 1, where in the substrate further comprises a first substrate and a sealing substrate.

23. The organic light emitting display of claim 7, wherein the ratio of the total area of the transmitting region with respect to the total area of the pixel regions and the transmitting region is between about 40% and about 70%.

24. The organic light emitting display of claim 1, further comprising openings in portions of the passivation film covering the transmitting region, the pixel electrodes being excluded from the openings.

25. The organic light emitting display of claim 11, wherein the substrate is at least two substrates attached to each other.

26. The organic light emitting display of claim 11, where in the substrate further comprises a first substrate and a sealing substrate.

27. The organic light emitting display of claim 17, wherein the ratio of the total area of the transmitting region with respect to the total area of the pixel regions and the transmitting region is between about 40% and about 70%.

28. The organic light emitting display of claim 11, wherein the first insulating film further comprises a passivation film, and the second insulating film comprises a gate insulating layer, an interlayer insulating layer, and a pixel defining layer.

29. The organic light emitting display of claim 11, further comprising openings in portions of the first insulating film covering the transmitting region, the pixel electrodes being excluded from the openings.

30. A method of manufacture for preventing distortion of a transmitted image from scattering and maintaining brightness and color coordinates in a transparent organic light emitting display device, the method comprising:

disposing a transmitting region on a substrate of a display unit;

disposing separate pixel units in pixel regions that are within spaces in the transmitting region and that are spaced apart from each other, each of the separate pixel units including a pixel electrode that is a reflection electrode;

disposing pixel circuits on a first surface of the substrate and on the pixel units, each of the pixel circuits corresponding to one of the pixel units such that the pixel electrode of the one of the pixel units overlaps an entirety of one of the pixel circuits, and each of the pixel circuits including a first thin film transistor, a second thin film transistor, and a capacitor;

disposing thin scan lines, data lines and driving power lines between the pixel circuits; disposing a first electrode on a second surface of the substrate;

disposing second electrodes facing the first electrode, the second electrodes being only in the separate pixel units and overlapping an entirety of the pixel circuits, respectively;

placing light transmission adjusting units to correspond to each of the pixel regions; and installing a controller to operate the light transmission adjusting units, wherein:

the ratio of the area of the pixel regions to the transmitting region is between about 20% and about 90%, the pixel units cover portions of the scan lines, data lines and driving power lines, and the light transmission adjustment units operate in communication with the operation of the pixel regions to limit the transmittance of external light.

* * * * *